United States Patent
Wang et al.

(10) Patent No.: US 8,942,315 B1
(45) Date of Patent: Jan. 27, 2015

(54) SYSTEMS, METHODS, AND DEVICES FOR FREQUENCY CALIBRATION OF TRANSMITTERS

(71) Applicant: Cypress Semiconductor Corporation, San Jose, CA (US)

(72) Inventors: Marshall Wang, Cupertino, CA (US); Miaoxing Xie, Pleasanton, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/494,218

(22) Filed: Sep. 23, 2014

Related U.S. Application Data (60) Provisional application No. 62/004,548, filed on May 29, 2014.

(51) Int. Cl.
*H04L 27/12* (2006.01)
*H04L 27/16* (2006.01)
(Continued)

(52) U.S. Cl.
CPC ............ *H04L 27/16* (2013.01); *H04L 27/0014* (2013.01); *H04L 7/0091* (2013.01); *H04L 7/0331* (2013.01); *H04L 27/122* (2013.01);
(Continued)

(58) Field of Classification Search
CPC ..... H03M 3/436; H03M 3/468; H03M 3/414; H03M 1/12; H03M 3/422; H03M 1/1019; H03M 3/38; H03C 3/0941; H03C 3/095; H03C 3/0975; H03L 7/0898; H03L 7/18; H04L 12/2801; H04L 27/20; H04L 45/245

USPC ......... 375/232, 260, 270, 272, 285, 295, 298, 375/299, 300, 302, 305, 306, 309, 311, 316, 375/322

See application file for complete search history.

(56) References Cited

U.S. PATENT DOCUMENTS 7,269,200 B2   9/2007   Igarashi
7,433,397 B2 *  10/2008   Garlepp et al. ............... 375/229
(Continued)

FOREIGN PATENT DOCUMENTS

WO        0122674 A1    3/2001

OTHER PUBLICATIONS

Fully integrated, low power 2.4 GHz Transceiver, EM Microelectronic, Sep. 13, 2012, p. 31, Marin SA.
(Continued)

*Primary Examiner* — Hirdepal Singh (57) ABSTRACT

Systems, methods, and devices are disclosed for implementing frequency calibration circuits. The devices may include a data source configured to generate a first data signal based on a first data value and a second data signal based on a second data value. The devices may include a gain control circuit configured to receive the first and second data signals from the data source, and generate a first modified data signal and a second modified data signal. The devices may include an oscillator circuit configured to generate a first output signal and a second output signal based, at least in part, on the first and second modified data signals. The devices may include a calibration circuit configured to determine an adjustment value based on the first and second output signals, and further configured to change a gain of the gain control circuit based on the determined adjustment value.

20 Claims, 6 Drawing Sheets

(51) Int. Cl.
*H04L 27/00* (2006.01)
*H04L 7/00* (2006.01)
*H04L 7/033* (2006.01)

(52) U.S. Cl.
CPC . *H04L 2027/0016* (2013.01); *H04L 2027/0018* (2013.01)
USPC .......... 375/306; 375/285; 375/295; 375/299; 375/300; 375/302

(56) References Cited

U.S. PATENT DOCUMENTS

| | | | |
|---|---|---|---|
| 7,672,645 B2 | 3/2010 | Kilpatrick et al. | |
| 7,944,309 B2 * | 5/2011 | Cao | 330/296 |
| 7,982,510 B2 | 7/2011 | Casagrande | |
| 8,000,428 B2 | 8/2011 | Staszewski et al. | |
| 8,115,525 B2 * | 2/2012 | Min et al. | 327/156 |
| 8,243,781 B2 | 8/2012 | Kim et al. | |
| 8,258,878 B2 * | 9/2012 | Yen et al. | 331/2 |
| 8,275,030 B2 * | 9/2012 | Werner et al. | 375/233 |
| 8,295,796 B2 * | 10/2012 | Sekiyama | 455/127.1 |
| 8,441,323 B2 * | 5/2013 | Lucas et al. | 331/1 A |
| 8,515,374 B2 * | 8/2013 | Dan et al. | 455/255 |
| 8,674,771 B2 * | 3/2014 | Darabi | 331/16 |
| 8,704,602 B2 * | 4/2014 | Miyanaga et al. | 331/16 |
| 8,860,478 B2 * | 10/2014 | Chen et al. | 327/156 |
| 2002/0079975 A1 * | 6/2002 | Asikainen et al. | 331/17 |
| 2004/0005866 A1 * | 1/2004 | Igarashi | 455/78 |
| 2005/0143014 A1 * | 6/2005 | Li et al. | 455/69 |
| 2005/0250464 A1 | 11/2005 | Spencer et al. | |
| 2006/0015917 A1 * | 1/2006 | Rozental | 725/111 |
| 2006/0088123 A1 | 4/2006 | Jensen et al. | |
| 2008/0048791 A1 * | 2/2008 | Fahim | 331/1 A |
| 2010/0283665 A1 * | 11/2010 | Bashir et al. | 342/174 |
| 2012/0263256 A1 * | 10/2012 | Waheed et al. | 375/296 |
| 2014/0232475 A1 * | 8/2014 | Elkholy et al. | 331/44 |

OTHER PUBLICATIONS

Han Shuguang, A Mixed-Loop CMOS Analog GFSK Modulator With Tunable Modulation Index, IEEE Transactions on Circuits and Systems, Express Briefs, vol. 54, No. 6, Jun. 2007.

* cited by examiner

SYSTEMS, METHODS, AND DEVICES FOR FREQUENCY CALIBRATION OF TRANSMITTERS

CROSS-REFERENCE TO RELATED APPLICATIONS

This application claims the benefit under 35 U.S.C. §119 (e) of U.S. Provisional Patent Application No. 62/004,548, filed on 2014 May 29, which is incorporated by reference herein in its entirety for all purposes.

TECHNICAL FIELD

This disclosure generally relates to transmitters and, more specifically, to frequency calibration techniques associated with transmitters.

BACKGROUND

Various communications devices, such as smart phones and tablet personal computers (PCs) may include various wireless communications devices that include transmitters configured to transmit data values to other communications devices. Such transmitters may transmit data based on a frequency modulation technique in which an operational or carrier frequency of a transmitter is modulated by a predetermined amount to identify, encode, or represent a particular data value. Conventional transmitters and conventional oscillators used in conventional transmitters remain limited because they are susceptible to operational variables and frequency channel dependent performance variations which may cause frequency drift and inconsistency in the representation of data values encoded in the frequency modulation. Moreover, conventional transmitters remain limited because they cannot efficiently and effectively calibrate themselves to account for such operational variables.

DETAILED DESCRIPTION

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific examples, it will be understood that these examples are not intended to be limiting.

As previously discussed, various computing devices, such as smart phones and tablet personal computers (PCs) may include various wireless communications devices that include transmitters configured to transmit data values to other communications devices. For example, such transmitters may include Bluetooth radios and other 2.4 GHz radios, or other devices compatible with any other suitable transmission technique.

Such transmitters may transmit data based on a frequency modulation technique in which an operational or carrier frequency of a transmitter is modulated by a predetermined amount to identify or represent a particular data value. For example, data may be encoded by adding or subtracting a fixed or predetermined frequency to a normal or target operational frequency of the transmitter. Thus, the target frequency may be increased or decreased to represent or encode different data values. In various embodiments, a communications standard, such as a Bluetooth standard, may require a frequency deviation that is at most +/−ten percent of a target frequency offset. For example, a target frequency offset or deviation may be 250 KHz from a carrier or operational frequency of an oscillator. Thus, the actual operational frequency deviation should be between 225 KHz and 275 KHz from the target frequency to properly encode zeroes and ones. If the deviation or modulation is outside of that range, a data value might not be properly identified by a demodulator included in a receiving unit.

Transmitters, and oscillators used in transmitters, may be susceptible to operational variables which may cause variances in the frequency deviation implemented during frequency modulation transmissions of data. For example, variances in a manufacturing process used to make the transmitter, operational temperatures, operational voltages, as well as performance variances of the oscillator at different frequency channels may cause the magnitude of generated frequency deviations to increase or decrease in an unpredictable manner. In such instances, the modulation introduced by the FM encoding technique may or may not be sufficient to be registered or detected properly by a demodulator that may be included in a receiving unit.

For example, a particular transmission technique or standard may require a particular frequency deviation to identify a particular data value. In one example, a Bluetooth standard may require a deviation of 250 KHz (with a tolerance of +/−ten percent) to properly encode a data value. If the transmitter experiences a performance variance or other nonlinear behavior due to the previously discussed variables, it might no longer generate a deviation of between about 225 KHz to 275 KHz, and might instead generate a deviation of only about 200 KHz. In this instance, a low value, such as a zero, as well as a high value, such as a one, will not be properly encoded because the frequencies generated by the transmitter are not sufficiently far enough apart to be properly identified by the receiving unit. Accordingly, the effect of the operational variables and operational frequency channel on the transmitter can greatly reduce the data transmission/reception fidelity. Conventional transmitters are not able to efficiently and effectively compensate for such variables, and consequently suffer from deleterious effects ranging from performance degradations, reductions in signal fidelity, to complete transmission failures.

Various systems, methods, and devices are disclosed herein that include a transmitter that may include or be coupled to a calibration circuit capable of calibrating the transmitter based on its current operational conditions and parameters. For example, devices as disclosed herein may include a data source that may generate a data signal based on at least one data value. The data signal may be provided to a gain control circuit configured to generate a modified data signal by amplifying or attenuating the received data signal by a first gain. The modified data signal may be provided to an oscillator circuit configured to generate an output signal. In various embodiments, the oscillator circuit may be a voltage controlled oscillator. Thus, the amplitude of the data signal and consequent modified data signal may change or modify the frequency of the output signal generated by the oscillator.

In some embodiments, the devices may also include a calibration circuit that may measure the output of the oscillator circuit when different data values are input to the gain control circuit. The calibration circuit may compare the measured values with reference values to generate an adjustment value. The adjustment value may be used to modify or change the gain of the gain control circuit to compensate for any differences between the measured values and the reference values. In this way, one or more components of the transmitter may be modified by the calibration circuit to compensate for and counteract any operational variables which may otherwise affect the performance of the transmitter. In some embodiments, the calibration circuit may perform such a calibration process in between transmission sessions. In various embodiments, the calibration process may be performed before the transmission of each data packet.

Figure 1:
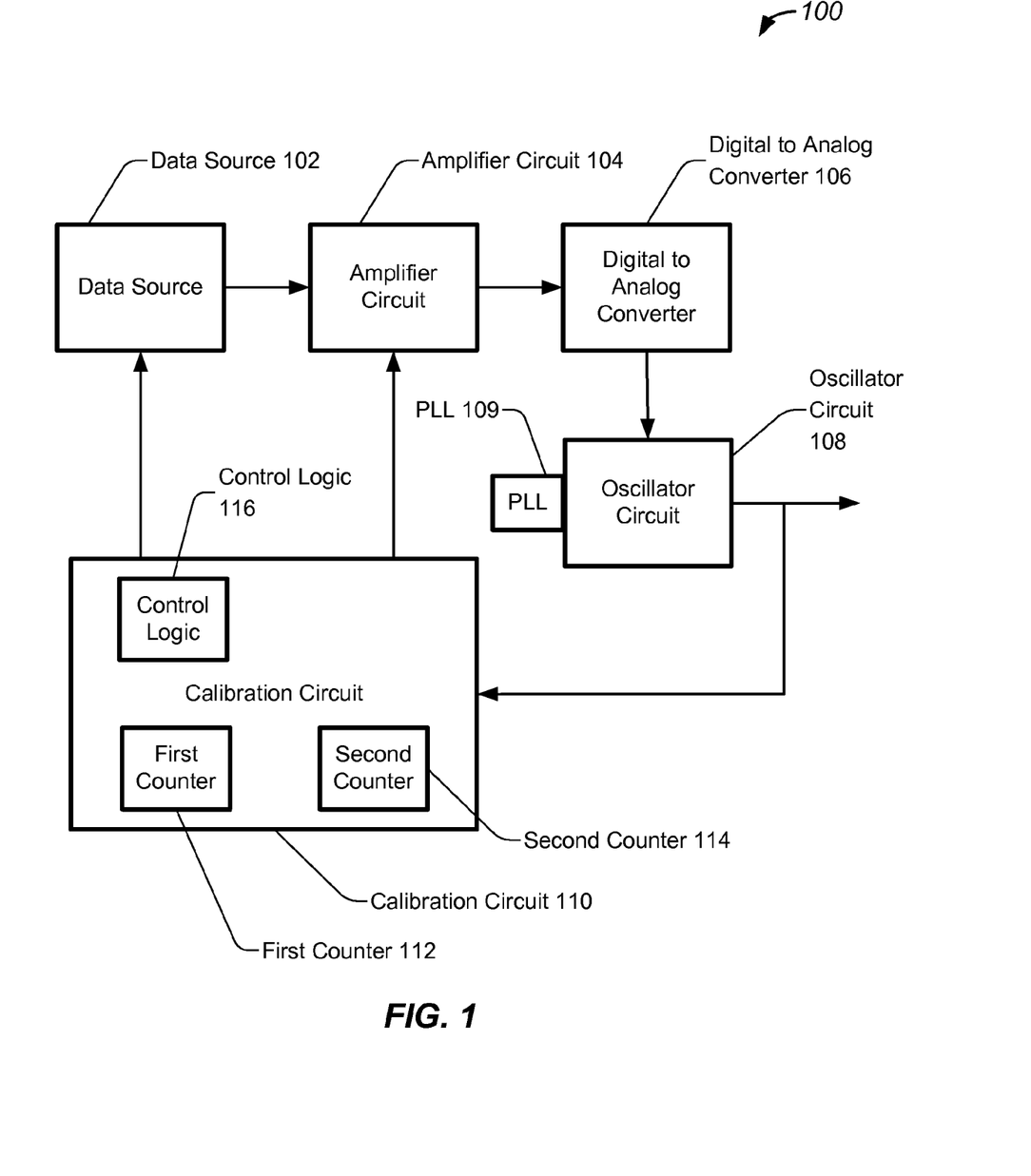
FIG. 1 illustrates a diagram of an example of a portion of a transmitter that includes a frequency calibration circuit, implemented in accordance with some embodiments.

FIG. 1 illustrates a diagram of an example of a portion of a transmitter that includes a frequency calibration circuit, implemented in accordance with some embodiments. As similarly stated above, a transmitter, such as transmitter 100, may be included in a device to transmit data to a receiving unit which may be included in another device. For example, transmitter 100 may be included in a personal computer (PC), tablet PC, or mobile communications device and may be configured to transmit data wirelessly using a frequency modulation (FM) transmission technique. Accordingly, transmitter 100 may include one or more components configured to generate a carrier wave having a particular frequency that is modulated to encode data values transmitted over the wireless connection. As similarly discussed above, a receiving unit communicating with transmitter 100 via the wireless connection may be configured to identify data values based on frequency deviations produced by transmitter 100. For example, a demodulator included in the receiving unit may be configured to record a high frequency and a low frequency produced by transmitter 100 during the transmission of data. The demodulator may be configured to determine a center frequency based on the recorded high and low frequencies, and may be further configured to identify data values based on a distance or deviation from the center frequency. In various embodiments, if the deviation is too small and outside of a tolerance specified by a transmission standard, such as a Bluetooth standard, the demodulator will not be able to distinguish the high and low frequencies from background noise, and transmission fidelity may be deleteriously affected.

As previously discussed, operational variables and conditions may affect the operation of components of transmitter 100, such as components of an oscillator circuit that may be included in transmitter 100. Accordingly, transmitter 100 may include a calibration circuit, such as calibration circuit 110, that may be configured to compensate for the operational variables and conditions to ensure that the operation of the oscillator circuit and transmitter 100 are compliant with the predetermined tolerances, thresholds, and standards, and transmit data over the wireless connection with high fidelity regardless of any operational conditions and variables that may be present, and regardless of which frequency channel is being used for transmission.

Accordingly, transmitter 100 may include a data source, such as data source 102. In various embodiments, data source 102 may include a memory module, data array, look-up table, or buffer configured to store one or more data values. The data values may be data associated with a particular software application or other program implemented on the device that includes transmitter 100. Accordingly, data values stored in data source 102 may be data values received from an application or program for transmission via transmitter 100. In some embodiments, data source 102 may be a data or memory interface that provides connectivity to another memory device which may be included in the device that includes transmitter 100. Thus, a main memory may include one or more data values that are retrieved by data source 102 and provided to other components of transmitter 100. As discussed in greater detail below with reference to FIGS. 4-6, data source 102 also may be configured to store one or more data values associated with a calibration process. Such data values may be preconfigured or may be received from calibration circuit 110 discussed in greater detail below.

In various embodiments, data source 102 may be configured to generate a data signal that represents the data values stored in memory. For example, data source 102 may be configured to generate a data signal that has a waveform, such as a square wave, that may toggle between a high and low value representing bits of data stored in memory, such as ones and zeroes. In this way, data source 102 may be configured to modulate an amplitude of the data signal to represent a data value stored in memory. Multiple data values may be represented serially in the data signal over a given period of time.

In various embodiments, the generated data signal may be received at an gain control circuit included in transmitter 100, such as gain control circuit 104. According to various embodiments, gain control circuit 104 may include control logic configured to dynamically generate a look-up table that is configured to modify the received data signal by a particular gain. For example, the amplitude of the received data signal may be represented by a first set of data values that identifies the voltage of the received data signal. Thus, as the data signal is received, and the amplitude of the data signal varies over time, particular data values included in the first set of data values may be used to identify the amplitude or voltage of the received data signal at each moment of time at which the data signal is sampled by gain control circuit 104. In various embodiments, gain control circuit 104 may be configured to generate a look-up table that includes a second set of data values by multiplying the first set of data values by a particular gain. In this way, gain control circuit 104 may map the sampled voltages of the received data signal to the second set of data values, thus effectively multiplying the amplitude of the received data signal by a particular gain to generate a modified data signal. It will be appreciated that the multiplication by the gain may amplify or attenuate the amplitude of the received data signal. In some embodiments, the look-up table may have been previously stored or programmed in gain control circuit 104.

In various embodiments, gain control circuit 104 may include one or more amplifiers, such as buffers, drivers, or operational amplifiers that may be configured to multiply or amplify the data signal by a gain or multiplier to increase or decrease the amplitude of the data signal. As will be discussed in greater detail below, such modification of the data signal may subsequently affect the behavior of an oscillator of transmitter 100, such as oscillator circuit 108. In various embodiments, the gain of gain control circuit 104 may be configurable such that the gain may be changed or modified by one or more components of transmitter 100. As will be discussed in greater detail below, the gain may be modified or changed by control circuitry or control logic, such as control logic 116 of calibration circuit 110.

Transmitter 100 may further include a digital to analog converter (DAC), such as DAC 106. In various embodiments, DAC 106 may receive the modified data signal generated by gain control circuit 104, which may be a digital signal, and may convert the modified data signal to an analog signal. In this way, DAC 106 may convert the modified data signal into an analog signal that may be processed by an oscillator of transmitter 100, such as oscillator circuit 108.

As stated above, transmitter 100 may include an oscillator, such as oscillator circuit 108. In various embodiments, oscillator circuit 108 may be an electronic oscillator that is configured to generate a periodic output or clock signal that has a target or central frequency. For example, oscillator circuit 108 may be configured to generate a clock signal having a frequency of about 2.4 GHz. In some embodiments, the output of oscillator circuit 108 may be provided to one or more other components of transmitter 100, such as an antenna or an amplifier coupled to the antenna. In this way, an output of oscillator circuit 108 may be used to drive a signal transmitted from an antenna of transmitter 100.

In various embodiments, oscillator circuit 108 may include a voltage controlled oscillator. Thus, an operational frequency of oscillator circuit 108 may be configured, modified, or controlled based, at least in part, on an input voltage received at one or more input terminals of oscillator circuit 108. In some embodiments, oscillator circuit is coupled to an output of DAC 106. Thus, a modified data signal representing data values from data source 102 may be provided to an input of oscillator circuit 108 thus causing a modulation or deviation of the output frequency of oscillator circuit 108 from its target frequency. For example, if oscillator circuit 108 has a target frequency of 2.4 GHz, oscillator circuit 108 may generate an output signal that has a frequency of 2.4 GHz, and variances in the amplitude of the modified data signal may cause the output signal generated by oscillator circuit 108 to vary by +/−250 KHz. In various embodiments, the amount of the deviation from the target frequency may be determined based on the amplitude of the modified data signal. For example, a deviation of 250 KHz may be increased by increasing the gain of the gain control circuit and the amplitude of the modified data signal. In this way, an output frequency of oscillator circuit 108 may be modulated to implement a frequency modulation (FM) transmission technique, and the modulation of the output frequency may encode or represent data values stored in memory for transmission from transmitter 100.

In various embodiments, oscillator circuit 108 may be coupled to or may include a phase locked loop (PLL), such as PLL 109. According to some embodiments, PLL 109 may be configured to stabilize, maintain, or "lock" oscillator circuit 108 at a particular operational frequency. For example, as discussed in greater detail below with reference to FIG. 3, PLL 109 may be configured to "lock" oscillator circuit 108 at a target frequency. For example, PLL 109 may be configured to "lock" oscillator circuit 108 at a frequency of 2.4 GHz, thus configuring oscillator circuit 108 to generate an output or clock signal that has a frequency of 2.4 GHz. As will be discussed in greater detail below, PLL 109 may be coupled or decoupled to oscillator circuit 108 via a switching mechanism, such as an electrical switch, or by toggling a charge pump between an on/off state, such as the charge pump discussed in greater detail below with reference to charge pump 311 of FIG. 3.

According to some embodiments, transmitter 100 may also include a calibration circuit, such as calibration circuit 110. In various embodiments, calibration circuit 110 may be configured to calibrate the operation of oscillator circuit 108 and other components of transmitter 100 to compensate for and counteract operational variables which may affect the performance of oscillator circuit 108. As previously discussed, oscillator circuit 108 as well as other components of transmitter 100, such as PLL 109, may be affected by various variables or factors ranging from operation conditions, such as an ambient temperature or operational voltage, to variables inherent in the circuitry itself, such as performance variances caused by variances inherent in a manufacturing process and variances due to the use of different frequency channels. Such variables may cause oscillator circuit 108 to behave unpredictably, and may cause a change in an amplitude of a frequency deviation from the target frequency generated by oscillator circuit 108. Thus, in the absence of a calibration circuit, such as calibration circuit 110, a deviation in the frequency of the output signal generated by oscillator circuit 108 may be sufficiently far from an acceptable tolerance that subsequent modulation of the output is not properly identified or registered by a receiving unit that is receiving the output of transmitter 100. This may be because the frequency deviations might no longer be large enough to be identified by a demodulator in a receiving unit.

Accordingly, calibration circuit 110 may be configured to analyze an output of oscillator circuit 108, and may be further configured to determine an adjustment value based on the analysis. In some embodiments, calibration circuit 110 may analyze the output of oscillator circuit 108 by monitoring its performance when encoding different data values and comparing the performance of oscillator circuit 108 with one or more reference values. Based on the comparison of the performance of oscillator circuit 108 with the reference values, calibration circuit may be configured to determine or generate an adjustment value that may be used to modify or adjust a gain of gain control circuit 104. In some embodiments, the adjustment value may modify the gain of gain control circuit 104 to effectively counteract the effect of the frequency deviation drift on transmission fidelity.

For example, if the frequency deviation generated by oscillator circuit 108 has drifted from an ideal deviation of about 250 KHz to a lesser value of about 150 KHz, an encoded low value of "0" and an encoded high value of "1" may no longer be of a low enough and high enough frequency to properly encode such values as determined by the requirements of a transmission standard such as Bluetooth, which may require a deviation of within +/−ten percent of 250 KHz. Accordingly, calibration circuit 110 may be configured to measure the frequencies generated by oscillator circuit 108 when encoding zeroes and ones to determine what deviation oscillator circuit 108 is generating when affected by operational and manufacturing variables. In this example, the ideal deviation is about +/−250 KHz (a total difference of 500 KHz) and the measured deviation is about +/−150 KHz (a total difference of about 300 KHz). Calibration circuit 110 may be configured to calculate a difference value (300 KHz) for oscillator circuit 108 and compare it with the reference value (500 KHz). For example, calibration circuit 110 may calculate a ratio by dividing 500 KHz by 300 KHz to generate a value of 1.66. The resulting value may be an adjustment value. Calibration circuit 110 may be configured to multiply the gain of gain control circuit 104 by the adjustment value (1.66), thus increasing the gain of gain control circuit 104. In this example, the increase in the gain of gain control circuit 104 will subsequently increase the amplitude of the data signal sent to oscillator circuit 108 thus increasing the frequency deviation or modulation generated by oscillator circuit 108 and returning the deviation or modulation to 500 KHz as opposed to 300 KHz.

In various embodiments, calibration circuit 110 may include at least one frequency counter. For example, calibration circuit 110 may include first counter 112 and second counter 114. In some embodiments, first counter 112 and second counter 114 may each be high frequency counters. Both first counter 112 and second counter 114 may be configured to receive an output of oscillator circuit 108, and may be further configured to count a number of periods or cycles within the output signal over a predetermined period of time. In some embodiments, the predetermined period of time may be a measurement period in which the first counter 112 or second counter 114 may be measuring or determining a number of cycles. Thus, first counter 112 may have a first measurement period, and second counter 114 may have a second measurement period. In some embodiments, the measurement periods may be relatively short. According to various embodiments, the measurement period may be between about 10 microseconds and 100 microseconds. For example, a measurement period may be about 25 microseconds. In some embodiments, the duration or length of the measurement period may be configured based on a designated calibration resolution. For example, a user may indicate a "high" calibration resolution is desired, an in response to receiving the user configuration, a longer duration, such as 100 microseconds, may be used. Similarly, a user may indicate a "low" calibration resolution is desired, an in response to receiving the user configuration, a shorter duration, such as 10 microseconds, may be used.

In various embodiments, different counters may be used to make different measurements. For example, first counter 112 may be configured to measure a first frequency of the output signal generated by oscillator circuit 108 when modulated to encode a first data value. Moreover, second counter 114 may be configured to measure a second frequency of the output signal generated by oscillator circuit 108 when modulated to encode a second data value. Thus, the first frequency may represent a frequency encoded first data value, and the second frequency may represent a frequency encoded second data value. The measured frequencies may be stored as data values in a data array included in calibration circuit 110. In various embodiments, a single counter may be used to make different measurements. Thus, either first counter 112 or second counter 114 may be configured to measure both the first frequency and the second frequency during a first measurement period and a second measurement period, respectively.

In various embodiments, calibration circuit 110 may include control logic such as control logic 116. In some embodiments, control logic 116 may be configured to process the measurements made by the at least one counter included in calibration circuit 110 to generate an adjustment value. Thus, control logic 116 may be configured to determine whether the frequency encoded data values are correct, and if not, control logic 116 may be further configured to determine what adjustments should be made to correct them.

Accordingly, control logic 116 may be configured to compare the measured frequencies with one or more designated reference values. In some embodiments, a designated reference value may represent an ideal frequency offset, spread, or modulation that should encode one or more data values. For example, designated reference values may identify an operational or target frequency of 2.4 GHz and an offset or frequency deviation of +/−250 KHz as an ideal target frequency and an ideal offset or deviation. In this example, an ideal signal received by a receiving unit may interpret a signal having a frequency of 2.4 GHz−250 KHz as encoding a first data value, which may be a "0," and may further interpret an ideal signal having a frequency of 2.45 GHz+250 KHz as encoding a second data value, which may be a "1."

In various embodiments, control logic 116 may be configured to subtract the first measured frequency from the second measured frequency to determine a difference value representing a difference between the first measured frequency and the second measured frequency. Control logic 116 may be configured to compare the difference value with a reference value by, for example, dividing the reference value by the difference value to obtain an adjustment factor or ratio. If the difference value is the same as the reference value, the ratio is one, and subsequently calculated adjustment value is 1, so the gain of gain control circuit 104 remains unchanged. However, if the difference value and the reference value are different, than the subsequently calculated adjustment value is not 1, and the gain of gain control circuit 104 may be modified by control logic 116, thus calibrating transmitter 100.

For example, if the reference value is 500 KHz, and the difference value is 250 KHz, then the adjustment value or ratio is 2. The adjustment ratio may be converted to one or more data values to be sent to the gain control circuit as an adjustment value. The adjustment value may be provided to gain control circuit 104 and may be used to adjust the gain of gain control circuit 104 by 2. The subsequent effect on oscillator circuit 108 will restore the output frequency deviation to within tolerance, which may be a deviation of 500 KHz (+/− 250 KHz from a center frequency).

Control logic 116 may also be configured to control other components of transmitter 100. For example, control logic 116 may be communicatively coupled to data source 102 and gain control circuit 104. Accordingly, control logic 116 may be configured to set data source 102 to a known data value during a measurement period, as will be discussed in greater detail below with reference to FIGS. 4-6. Moreover, control logic 116 may be configured to provide the adjustment value to gain control circuit 104 to modify, change, or adjust, the gain of gain control circuit 104, and consequently counteract the deviation drift that oscillator circuit 108 may be experiencing. Control logic 116 may also be coupled to PLL 109 to control the coupling and decoupling of PLL 109 with oscillator circuit 108, as will be discussed in greater detail below with reference to FIGS. 2-6.

Figure 2:
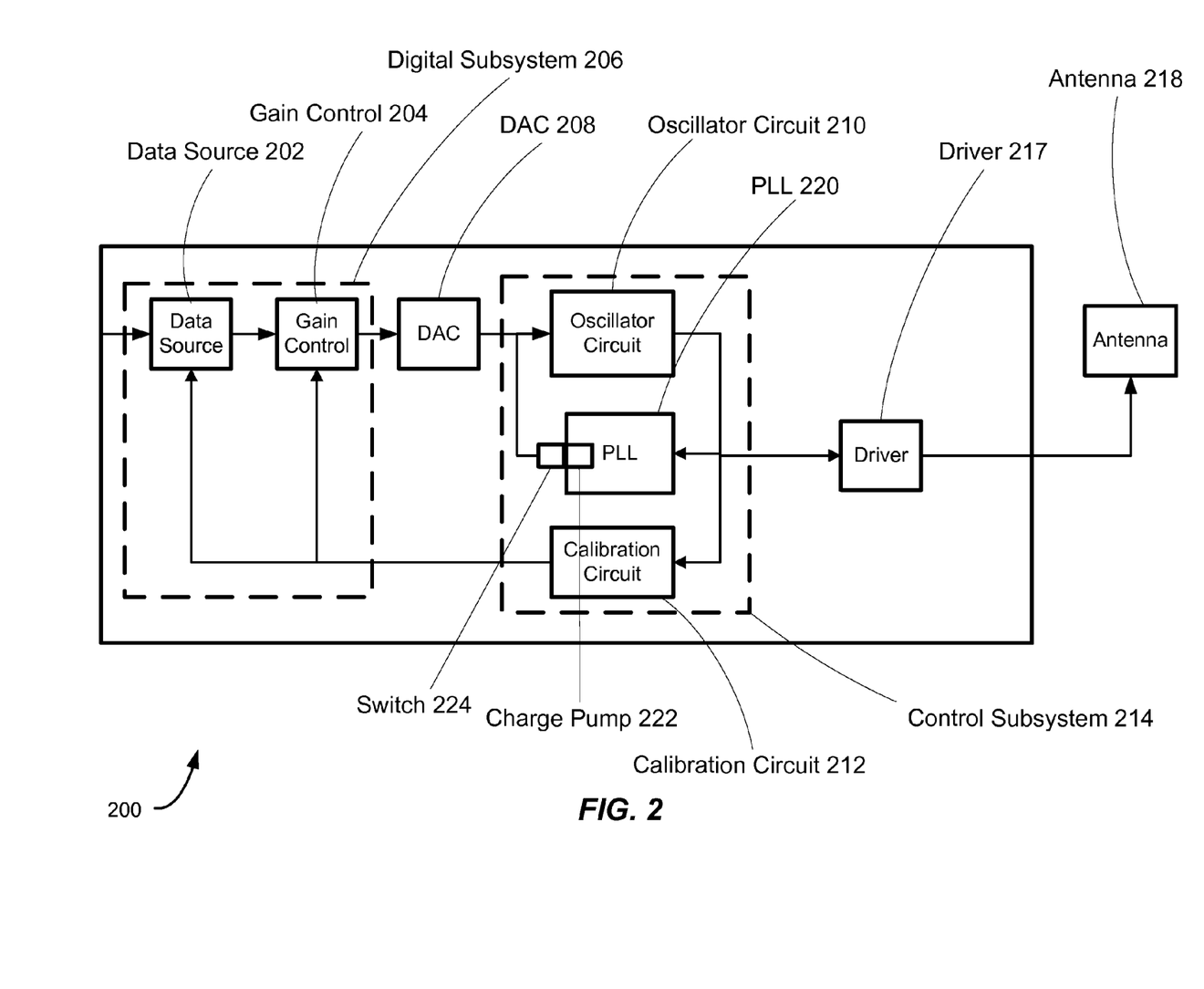
FIG. 2 illustrates a diagram of another example of a portion of a transmitter that includes a frequency calibration circuit, implemented in accordance with some embodiments.

FIG. 2 illustrates a diagram of another example of a portion of a transmitter that includes a frequency calibration circuit, implemented in accordance with some embodiments. As similarly discussed above with reference to FIG. 1, a transmitter, such as transmitter 200, may include a calibration circuit, such as calibration circuit 212, that may be configured to compensate for operational variables and conditions to ensure that the operation of the oscillator circuit and transmitter 200 are compliant with predetermined communications thresholds and standards. Furthermore, the components of transmitter 200 may be implemented as different subsystems in a chip, silicon package, or reprogrammable logic device. In this way, all components of the transmitter may be implemented in a single package that may easily be integrated with other components of a device, such as a tablet PC or mobile communications device.

As similarly discussed above with reference to FIG. 1, transmitter 200 may also include a data source, a gain control circuit, a DAC, an oscillator circuit, and a calibration circuit.

For example, transmitter 200 may include data source 202, gain control circuit 204, DAC 208, oscillator circuit 210, and calibration circuit 212. These components may be implemented as part of a transmitting/receiving system. For example, data source 202 and gain control circuit 204 may be included in digital subsystem 206 configured to perform one or more digital logic operations associated with the generation of a digital data signal. Moreover, oscillator circuit 210 and calibration circuit 212 may be included in control subsystem 214 configured to generate an output signal for transmission from transmitter 200, and further configured to calibrate transmitter 200. As will be discussed in greater detail below, oscillator circuit 210 may also be coupled to a phase locked loop (PLL), such as PLL 220. Moreover, the coupling of oscillator circuit 210 with PLL 220 may be modified by one or more charge pumps, such as charge pump 222, and/or one or more switches, such as switch 224.

In various embodiments, the components of transmitter 200 and various subsystems may be communicatively coupled to each other via one or more communications buses. Moreover, in some embodiments, all of the components and subsystems of transmitter 200 may be implemented in a single chip. Accordingly, the components of transmitter 200 may be implemented in a single integrated package which may be installed or integrated with a device such as a mobile communications device.

Figure 3:
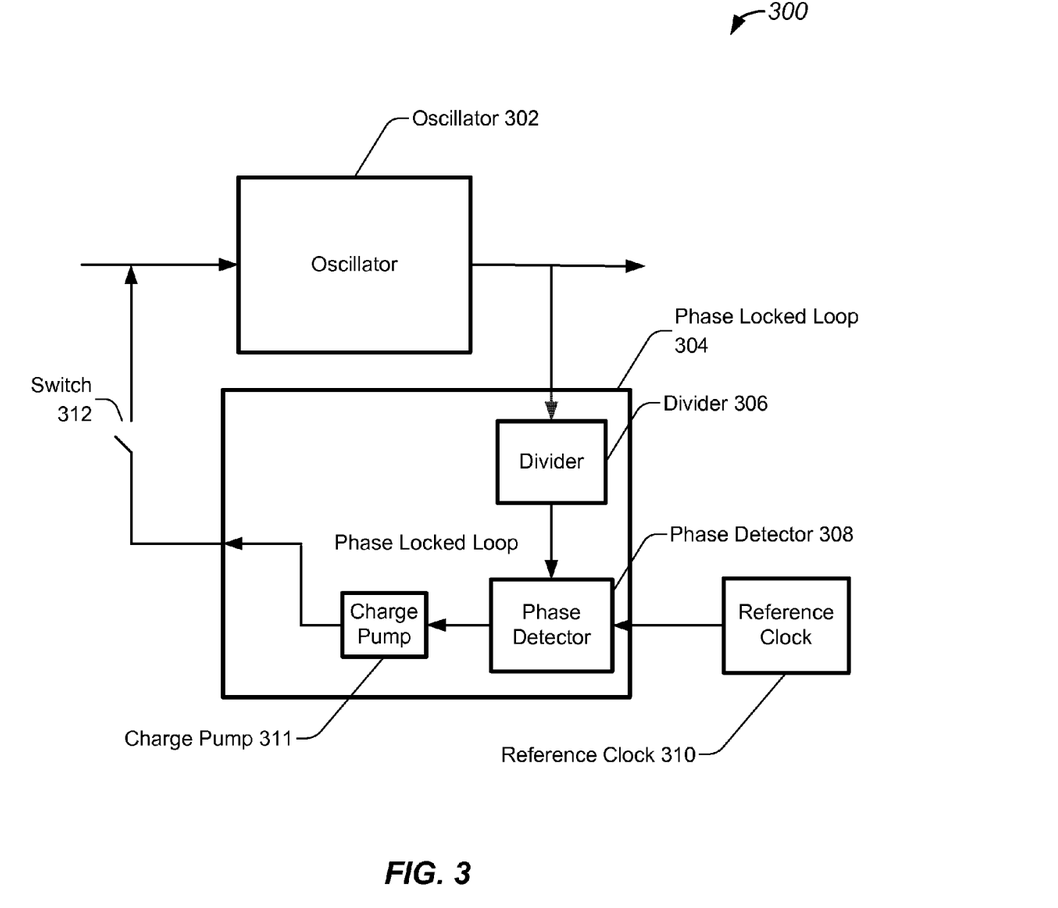
FIG. 3 illustrates a diagram of an example of an oscillator circuit implemented with a phase locked loop, implemented in accordance with some embodiments.

FIG. 3 illustrates a diagram of an example of an oscillator circuit implemented with a phase locked loop, implemented in accordance with some embodiments. As similarly discussed above, an oscillator circuit may include an oscillator, such as oscillator 302, and a phase locked loop (PLL), such as PLL 304. Thus, according to some embodiments, the oscillator may be regulated by a PLL. Furthermore, the PLL may be coupled or decoupled to the oscillator during a calibration process. As will be discussed in greater detail below with reference to FIG. 5, the coupling and decoupling of the PLL from the oscillator at the appropriate times during calibration of a transmitter may mitigate the effect of the PLL on the oscillator during the calibration process and ensure accurate and effective calibration of the transmitter.

In various embodiments, oscillator circuit 300 may include oscillator 302. As previously discussed, oscillator 302 may be an electronic oscillator configured to generate a periodic signal that may be an output or clock signal used to transmit data via an antenna. In some embodiments, oscillator 302 may be a voltage controlled oscillator. Accordingly, oscillator 302 may be configured to modulate a frequency of the generated output signal based on one or more input voltages received at one or more input terminals of oscillator 302. For example, a low or negative voltage received at an input terminal may cause oscillator 302 to decrease the frequency of the output signal an amount that is proportional to the amplitude of the received voltage. Similarly, a high or positive voltage received at the input terminal may cause oscillator 302 to increase the frequency of the output signal an amount that is proportional to the amplitude of the received voltage.

Accordingly, oscillator 302 may be coupled to PLL 304 which may be configured to regulate, at least in part, the operation of oscillator 302. Thus, PLL 304 may be configured to use a reference signal to match or lock a phase and/or frequency of oscillator 302 with the reference signal. In some embodiments, PLL 304 may include divider 306 which may be a frequency divider configured to divide an output frequency of oscillator 302 by a predetermined amount to match the output frequency with the frequency of the reference signal. PLL 304 may include or may be coupled to reference clock 310 which may be configured to generate the reference signal. Thus, reference clock 310 may include a separate oscillator which may be a crystal oscillator that may generate a separate clock signal that is used as a reference signal. PLL 304 may further include phase detector 308 which may receive an output of divider 306 and an output of reference clock 310. Accordingly, phase detector 308 may be configured to generate a difference signal based on a phase difference between the output of divider 306 and the output of reference clock 310. PLL 304 may also include charge pump 311 which may be configured to generate an output signal based on the difference signal to compensate for any phase difference between the output of divider 306 and the output of reference clock 310.

Oscillator circuit 300 may also include switch 312 which may be configured to couple or decouple PLL 304 with the input of oscillator 302. Thus, switch 312 may be configured to enable or disable the operation of PLL 304 and its effect on oscillator 302 by creating "open loop" and "closed loop" configurations based on the position or status of switch 312. In various embodiments, switch 312 may be communicatively coupled to a calibration circuit, as discussed above with reference to FIG. 1 and FIG. 2. Thus, control logic included in a calibration circuit, such as calibration circuit 110 and 212, may be configured to control the operation of switch 312, and may be further configured to couple and decouple a PLL, such as PLL 304, from an oscillator, such as oscillator 302, during calibration of a transmitter. Furthermore, similar "open loop" and "closed loop" configurations may also be generated by turning charge pump 311 on or off. Thus, the calibration circuit may also be configured to toggle charge pump 311 between an "off" and an "on" state to create "open loop" and "closed loop" modes of operation.

Figure 4:
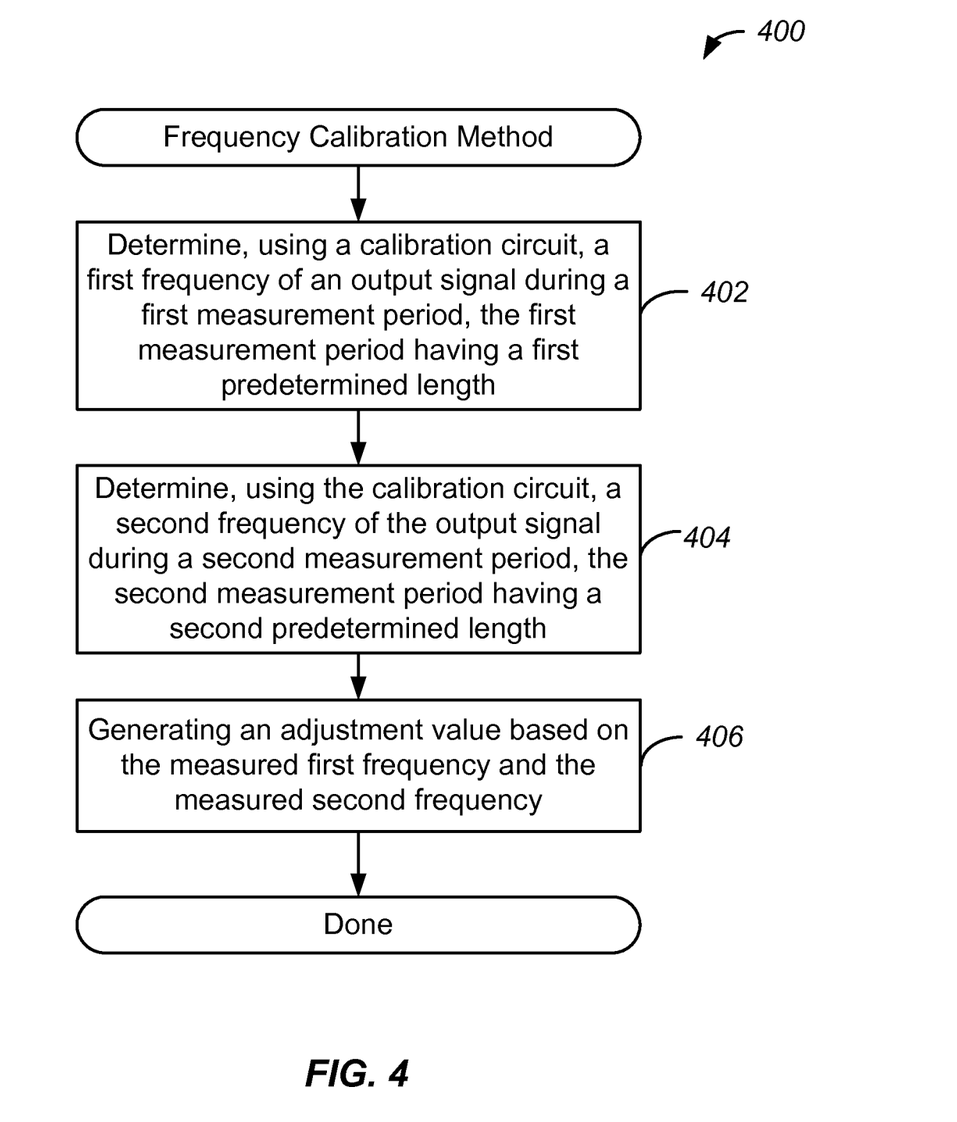
FIG. 4 illustrates a flow chart of an example of a frequency calibration method implemented in accordance with some embodiments.

FIG. 4 illustrates a flow chart of an example of a frequency calibration method implemented in accordance with some embodiments. As similarly discussed above, a calibration circuit may be included in a transmitter and may be configured to analyze an output of an oscillator circuit to configure the oscillator circuit and transmitter to compensate for any operational and manufacturing variables that may affect the performance of the oscillator circuit by, for example, changing a frequency deviation of the output of the oscillator circuit. Thus, the oscillator circuit may generate an output signal that may function as a carrier wave for a frequency modulation (FM) transmission technique. The calibration circuit may analyze the output signal and make one or more adjustments to ensure that the oscillator circuit continues to operate in accordance with the performance requirements of the standard used for FM transmission which may be, for example, a Bluetooth standard.

Accordingly, method 400 may commence at operation 402, during which a first frequency of an output signal may be determined during a first measurement period. Accordingly, a component of the transmitter, such as the calibration circuit, may analyze the output signal generated by the oscillator circuit to determine its frequency. Moreover, this determination may be made for a given or designated data value. Thus, the frequency may be determined for an output signal generated based on a designated target frequency and a first designated encoded data value. According to some embodiments, the first measurement period may have a first predetermined length. Thus, the calibration circuit may count the number of clock cycles over a first designated period of time to calculate a first frequency of the output signal.

In some embodiments, method 400 may proceed to operation 404, during which a second frequency of the output signal may be determined during a second measurement period. Accordingly, a component of the transmitter, such as the calibration circuit, may again analyze the output signal generated by the oscillator circuit to determine its frequency. In some embodiments, this determination may be made for a different given or designated data value. Thus, the frequency may be determined for an output signal generated based on a designated target frequency and a second designated encoded data value. In some embodiments, the second measurement period may have a second predetermined length. Thus, the calibration circuit may count the number of clock cycles over a second designated period of time to calculate a second frequency of the output signal.

According to various embodiments, method 400 may proceed to operation 406, during which an adjustment value may be generated based on the measured first frequency and the measured second frequency. Thus, the calibration circuit may analyze the frequency that was measured when encoding the first data value as well as the frequency that was measured when encoding the second data value to determine an adjustment value that may be used to calibrate the transmitter to compensate for any deviations from ideal operating conditions. For example, if a measured deviation of the frequencies is too low, the calibration circuit may generate an adjustment value configured to adjust a gain of a gain control circuit to compensate. In this way, and as discussed in greater detail below with reference to FIGS. 5 and 6, the calibration circuit may periodically and/or dynamically measure and verify the output signal generated by the oscillator circuit, and adjust one or more components of the transmitter to ensure operational compliance with transmission standards used by the transmitter.

Figure 5:
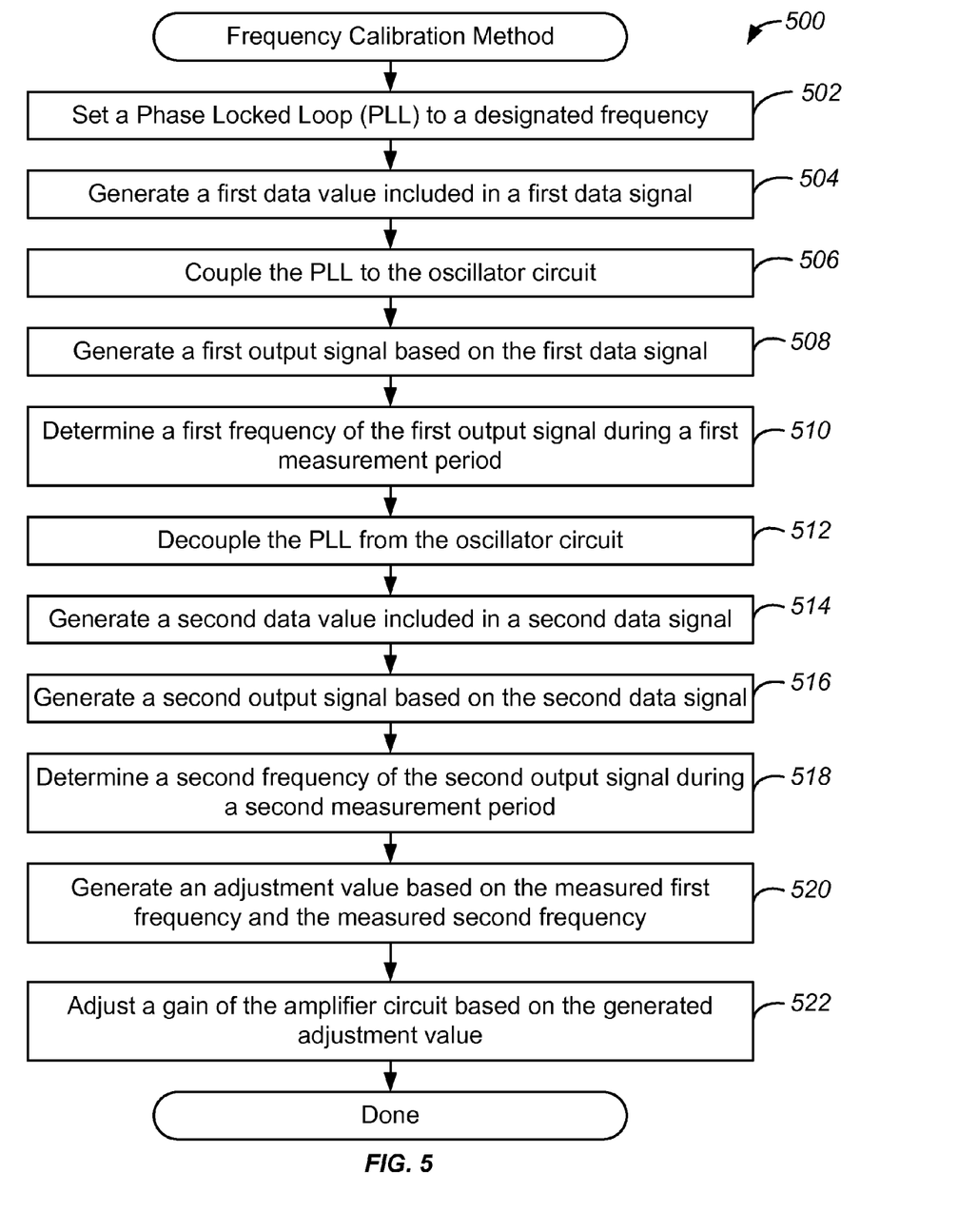
FIG. 5 illustrates a flow chart of another example of a frequency calibration method implemented in accordance with some embodiments.

FIG. 5 illustrates a flow chart of another example of a frequency calibration method implemented in accordance with some embodiments. As similarly discussed above, a calibration circuit may be included in a transmitter and may be configured to analyze an output of an oscillator circuit to configure the oscillator circuit and transmitter to compensate for any operational and manufacturing variables that may affect the performance of the oscillator circuit. In various embodiments, a phase locked loop (PLL) that may be included in or coupled to the oscillator circuit may be coupled and decoupled to the oscillator circuit to prevent the PLL from affecting readings and/or measurements made during a calibration process. Thus, the coupling and decoupling of the PLL may increase the accuracy of the calibration process, and may increase the fidelity of the data transmitted by the transmitter over a wireless communications link.

Accordingly, method 500 may commence at operation 502 during which a phase locked loop (PLL) may be set to a designated frequency. As previously discussed, a PLL may be configured to set and maintain a target frequency of an oscillator circuit by using, among other things, a phase detector and a reference signal. Accordingly, during operation 502, PLL may receive a reference signal and generate a difference signal.

Method 500 may proceed to operation 504 during which a first data value included in a first data signal may be generated. Accordingly, a component of the transmitter, such as a data source, may generate a data signal based on several data values that are to be transmitted from the transmitter. In various embodiments, operation 504 may occur during a frequency calibration process. Thus, the data values may be set to a predetermined or designated data value to facilitate the calibration process. For example, the data values may be set to a first known value which may be all zeroes. As previously discussed, the data signal may be modified by a gain control circuit. In various embodiments, the data source may be set to the known value by another component of the transmitter, such as control logic of the calibration circuit.

Method 500 may proceed to operation 506 during which the PLL may be coupled to the oscillator circuit. As similarly discussed above, one or more switches and/or a charge pump may be configured to couple or decouple the PLL from the oscillator circuit. In various embodiments, during operation 506, the switch may be closed and/or the charge pump may be turned on to electrically couple the PLL to the oscillator circuit. In some embodiments, the operation of the switch and/or charge pump may be controlled by the calibration circuit. For example, control logic included in the calibration circuit may be configured to close the switch and/or turn on the charge pump during operation 506. In some embodiments, after coupling the PLL, method 500 may wait for a designated period of time before proceeding to operation 508. For example, method 500 may wait for between about 10 microseconds to 100 microseconds. In one example, method 500 may wait for 30 microseconds. In various embodiments, waiting for a designated period of time in this way enables the circuit to stabilize and settle, thus ensuring that the calibration process is accurate.

Method 500 may proceed to operation 508 during which a first output signal may be generated based on the first data signal. In various embodiments, a component of the oscillator circuit, such as a voltage controlled oscillator, may generate a first output signal based on the first data signal generated at operation 504 and further based on the feedback provided by the PLL when coupled during operation 506. Accordingly, the oscillator circuit may generate an output signal having a target frequency set, at least in part, by the PLL, and modified or modulated by the first data signal. As previously discussed, the first data signal may have an amplitude that is low and represents a data value of zero because the data being sent from the data source is all zeroes. Accordingly, during operation 508, the first output signal might have a frequency that the target frequency set by the PLL minus a particular frequency deviation. For example, if the PLL has a target frequency of 2.45 GHz and the oscillator has a target deviation of +/−250 KHz, the first output signal might have a frequency of 2.45 GHz−250 KHz. In various embodiments, the performance characteristics of the oscillator may be affected by operational variables, and the first output signal might be out of tolerance, and might actually have a frequency of about 2.45 GHz−100 KHz.

Method 500 may proceed to operation 510 during which a first frequency of the first output signal may be determined during a first measurement period. In various embodiments, the calibration circuit may be configured to measure the frequency of the first output signal that was generated during operation 508. Accordingly, the calibration circuit may include a high frequency counter that is configured to count a number of clock cycles of the first output signal that occur during a designated or predetermined period of time. Thus, the counter may be configured to count cycles for a first measurement period which may have a designated length or duration. For example, the counter may be configured to count cycles for a period of between about 10 microseconds to 100 microseconds. In one example, the counter may be configured to count cycles for about 25 microseconds. In some embodiments, the counter may be configured to calculate a first measured frequency by (1) dividing the length of the first measurement period by the number of cycles counted to obtain a period or duration of a cycle, and (2) inverting the period or duration of a cycle to obtain the frequency. For example, if the counter counts a total of 62,500 cycles during a measurement period of 25 microseconds, the calibration circuit may first calculate a period of 0.4 nanoseconds. The calibration circuit may then invert the calculated period to obtain a first measured frequency of 2.5 GHz.

Method 500 may proceed to operation 512 during which the PLL may be decoupled from the oscillator circuit. Accordingly, once the measurement of the first frequency is complete, the transmitter may be configured to measure a second frequency. In some embodiments, the PLL which was previously coupled to the oscillator circuit may be decoupled from the oscillator circuit during operation 512. As similarly discussed above, such decoupling may be controlled by control logic included in a calibration circuit that may be coupled to a switch and/or charge pump. In various embodiments, decoupling the PLL in this way prevents the PLL from affecting the output signal generated by the oscillator. In some embodiments, if the PLL were not decoupled, the PLL may otherwise pull the modulated frequency of the output signal back towards the target frequency and away from the modulated frequency. Thus, the operation of the PLL, if not decoupled, may affect the representation of an encoded data value over a period of time, and may interfere with the calibration process. Accordingly, during operation 512, the PLL may be decoupled. Furthermore, according to some embodiments, operation 512 may further include turning off the charge pump that is included in the PLL. In this way, the operation of the PLL may be completely decoupled from the oscillator, and may be prevented from affecting the output signal generated by the oscillator.

Method 500 may proceed to operation 514 during which a second data value included in a second data signal may be generated. As similarly discussed above, a component of the transmitter, such as a data source, may generate a data signal based on several data values that are to be transmitted from the transmitter. The data values may be set to a predetermined or designated data value to facilitate a calibration process. For example, the data values may be set to a second known value which may be all ones. As previously discussed, the data signal may be modified by the gain control circuit. In various embodiments, the data source may be set to the known value by another component of the transmitter, such as control logic of the calibration circuit.

Method 500 may proceed to operation 516 during which a second output signal may be generated based on the second data signal. In various embodiments, a component of the oscillator circuit, such as the voltage controlled oscillator, may generate a second output signal based on the second data signal generated at operation 514. Accordingly, the oscillator circuit may generate an output signal having a target frequency that is modified or modulated by the second data signal. The second data signal may have an amplitude of about 0.9V when representing a first data value, such as a zero. The amplitude may increase by about 50 mV to represent a second data value, such as a one. Accordingly, during operation 516, the second output signal might have a frequency that equals the target frequency modulated by an amount commensurate or proportional to the amplitude of the second data signal. For example, if the target frequency is 2.45 GHz and the data signal represents all ones thus causing a modulation of the second output signal, the second output signal might have a frequency of 2.45 GHz+250 KHz. As similarly discussed above, operational variables may cause deviation drift which may also affect the fidelity and accuracy of the second frequency. Thus, the frequency of the second output signal might be different than the ideal frequency.

Method 500 may proceed to operation 518 during which a second frequency of the second output signal may be determined during a second measurement period. As similarly discussed above with reference to operation 510, the calibration circuit may also be configured to measure the frequency of the second output signal that was generated during operation 516. Accordingly, the calibration circuit may include a high frequency counter that is configured to count a number of clock cycles of the second output signal that occur during a designated or predetermined period of time. In some embodiments, the counter may be the same counter or a different counter than the counter previously used in operation 510. The counter may be configured to count cycles for a second measurement period which may have a designated length or duration. For example, the counter may be configured to count cycles for a period of between about 10 microseconds to 100 microseconds. In one example, the counter may be configured to count cycles for about 25 microseconds. The counter may be configured to calculate a second measured frequency by (1) dividing the length of the second measurement period by the number of cycles counted to obtain a period or duration of a cycle, and (2) inverting the period or duration of a cycle to obtain the frequency.

Method 500 may proceed to operation 520 during which an adjustment value may be generated based on the measured first frequency and the measured second frequency. In various embodiments, a component of the transmitter, such as the calibration circuit, may include control logic configured to execute one or more mathematical operations based, at least in part, on the previously measured frequencies. For example, the calibration circuit may include an arithmetic logic unit implemented in control logic that is configured to perform arithmetic and logical operations. As discussed in greater detail below with reference to FIG. 6, the calibration circuit may be configured to calculate a difference between the first measured frequency and the second measured frequency. The calibration circuit may compare the calculated difference value with a reference value to determine whether or not the frequency difference or deviation is acceptable and what adjustment value should be generated. For example, the calibration circuit may generate an adjustment value that represents a ratio of the reference value to the calculated difference value.

Method 500 may proceed to operation 522 during which a gain of the gain control circuit may be adjusted based on the generated adjustment value. In various embodiments, a component of the transmitter, such as the calibration circuit, may modify the gain of the gain control circuit that amplifies or attenuates the data signal sent to the oscillator circuit. For example, the gain of the gain control circuit may be multiplied or divided by the adjustment value. In this way, the calibration circuit may adjust one or more components of the transmitter to ensure operational compliance with transmission standards used by the transmitter.

While one iteration of method 500 has been described, the calibration process described in method 500 may be performed numerous times. For example, method 500 may be implemented prior to the transmission of every data packet that is transmitted from the transmitter via the wireless communications link. Thus, each data packet is sent via a transmitter that has been calibrated to compensate for any operational and manufacturing variables which may otherwise affect the fidelity of the data transmission.

Furthermore, while method 500 describes operations 502-522 in a particular fashion, the need not necessarily be performed in the order as described and may be performed in a different order. For example, the generation of and measurement of the second data signal associated with the second data value may occur before that of the first data signal associated with the first data value.

Figure 6:
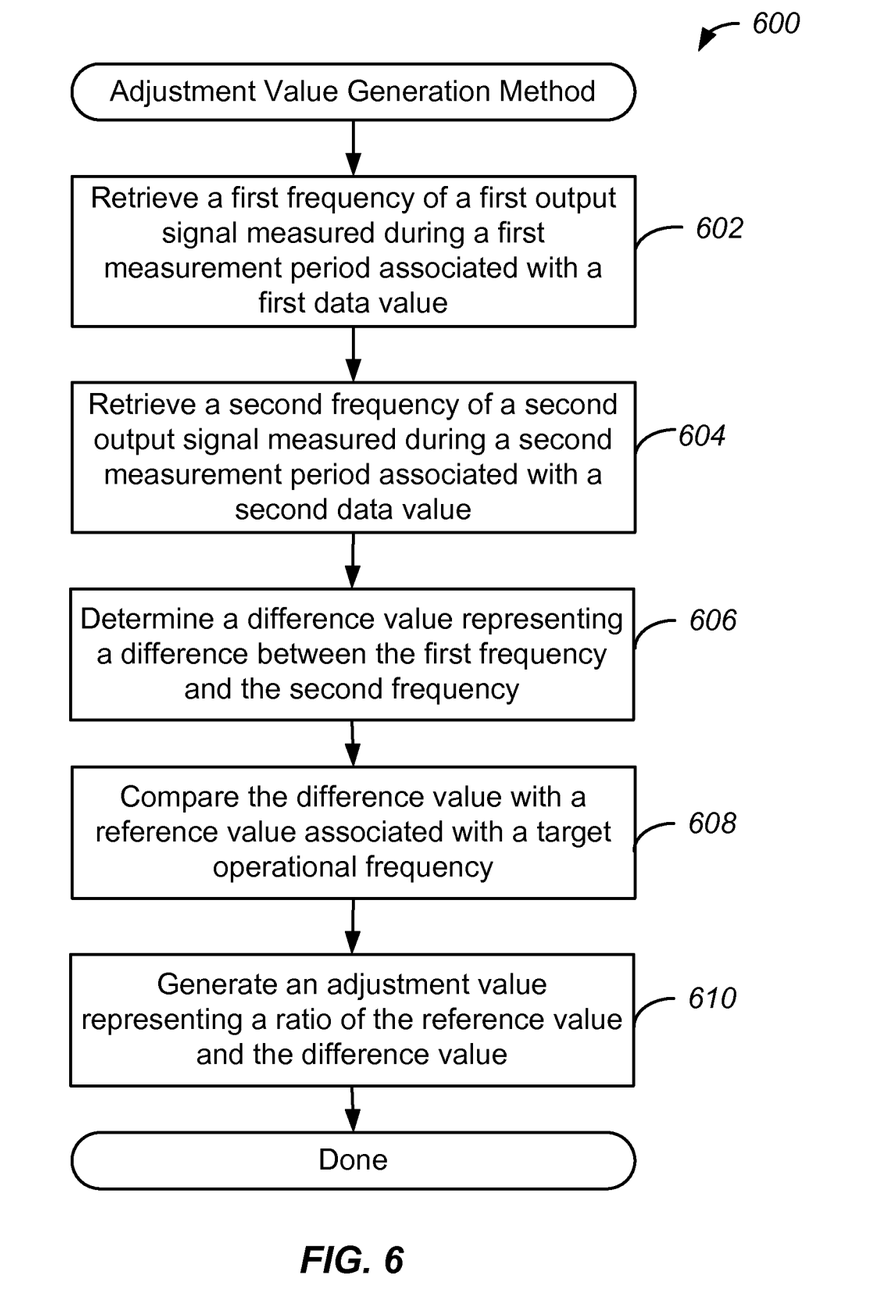
FIG. 6 illustrates a flow chart of an example of an adjustment value generation method implemented in accordance with some embodiments.

FIG. 6 illustrates a flow chart of an example of an adjustment value generation method implemented in accordance with some embodiments. As similarly discussed above, an adjustment value may be generated to adjust a gain of a gain control circuit to compensate for any deviations or modifications in the operation of the oscillator circuit. Thus, the adjustment value may be used to calibrate one or more components of the transmitter, such as the gain control circuit, and ensure that the transmitter is compliant with communication standards that may be associated with the wireless communications link the transmitter is included in.

Accordingly, method 600 may proceed with operation 602 during which a first frequency of a first output signal may be retrieved. As previously discussed above with reference to FIG. 5, the first frequency may have been measured during a first measurement period associated with a first data value. Thus, the first frequency may have been stored as one or more data values in a memory device, memory module, or data array which may be included in or coupled to the calibration circuit. During operation 602, the one or more data values identifying the first frequency may be retrieved for subsequent analysis.

Method 600 may proceed to operation 604 during which a second frequency of a second output signal may be retrieved. As previously discussed with reference to FIG. 5, the second frequency may have been measured during a second measurement period associated with a second data value. Thus, the second frequency may have been stored as one or more data values in the memory device, memory module, or data array which may be included in or coupled to the calibration circuit. During operation 604, the one or more data values identifying the second frequency may be retrieved for subsequent analysis.

Method 600 may proceed to operation 606 during which a difference value representing a difference between the first frequency and the second frequency may be determined. As similarly discussed above, a component of the transmitter, such as the calibration circuit, may include an arithmetic logic unit (ALU) configured to perform one or more arithmetic and logical operations on the retrieved data values. Accordingly, the calibration circuit may subtract the first frequency from the second frequency to generate a difference value representing a difference between the first frequency and the second frequency.

Method 600 may proceed to operation 608 during which the difference value may be compared with a reference value associated with a target operational frequency. Accordingly, a reference value may have been previously stored in a memory associated with the calibration circuit. The reference value may represent an ideal frequency deviation associated with the frequency modulation technique being used. For example, an ideal frequency deviation may be +/−250 KHz from a center or target frequency of about 2.45 GHz. Thus, the reference value may be about 500 KHz. The reference value may be compared with the calculated difference value which may be smaller or larger depending upon the effect the operational variables have had on the oscillator circuit. In one example, the transmitter may be significantly affected by operational conditions and/or frequency channel performance variations, and may have produces a calculated difference value of 300 KHz, which may be outside of a tolerance specified by various transmission standards, such as a Bluetooth standard.

Method 600 may proceed to operation 610 during which an adjustment value representing a ratio of the reference value and the difference value may be generated. Thus, the reference value may be divided by the calculated difference value to obtain a number that is subsequently multiplied with the gain of the gain control circuit. In one example, if the reference value is the same as the difference value, the ratio is one, and the gain of the gain control circuit remains unchanged. In another example, if the difference value is less than the reference value, the ratio is greater than one, and the gain of the gain control circuit is increased or amplified, thus increasing the frequency deviation/modulation of the oscillator circuit. Returning to a previous example, if the reference value is 500 KHz and the calculated difference value is 300 KHz, the resulting ratio is 1.66. Similarly, if the difference value is greater than the reference value, the ratio is less than one, and the gain of the gain control is decreased or attenuated, thus decreasing the frequency deviation/modulation of the oscillator circuit. In this way, the frequency modulation of the output signal of the oscillator circuit may be measured, compared with a reference value, and modified to ensure compliance with transmission standards used by the transmitter.

Although the foregoing concepts have been described in some detail for purposes of clarity of understanding, it will be apparent that certain changes and modifications may be practiced within the scope of the appended claims. It should be noted that there are many alternative ways of implementing the processes, systems, and devices. Accordingly, the present examples are to be considered as illustrative and not restrictive.

What is claimed is:

1. A device comprising:
   a data source configured to generate a first data signal based on a first data value, and further configured to generate a second data signal based on a second data value;
   a gain control circuit configured to receive the first and second data signals from the data source, and further configured to generate a first modified data signal and a second modified data signal by amplifying the received first and second data signals by a gain;
   an oscillator circuit configured to generate a first output signal and a second output signal based, at least in part, on the first and second modified data signals, the first output signal having a first frequency, and the second output signal having a second frequency; and
   a calibration circuit configured to receive the first and second output signals generated by the oscillator circuit, configured to determine an adjustment value based on the received first and second output signals, and further configured to change the gain of the gain control circuit based on the determined adjustment value.

2. The device of claim 1, wherein the calibration circuit is configured to determine the adjustment value based on a comparison between a difference value and a reference value, the difference value representing a difference between the first frequency and the second frequency.

3. The device of claim 2, wherein the calibration circuit includes at least one frequency counter configured to measure the first frequency during a first measurement period, and further configured to measure the second frequency during a second measurement period.

4. The device of claim 3, wherein the data source is configured to generate the first data value during the first measurement period, wherein the at least one frequency counter is configured to measure the first output signal during the first measurement period, wherein the data source is further configured to generate the second data value during the second measurement period, wherein the at least one frequency counter is further configured to measure the second output signal during the second measurement period, and wherein the first data value is different than the second data value.

5. The device of claim 4, wherein the oscillator circuit is a voltage controlled oscillator configured to generate the first frequency based, at least in part, on an amplitude of the first modified data signal, and further configured to generate the second frequency based, at least in part, on an amplitude of the second modified data signal.

6. The device of claim 5, wherein the oscillator circuit includes a phase lock loop (PLL) configured to regulate a phase and frequency of the oscillator circuit.

7. The device of claim 6, wherein the PLL is configured to be coupled to the oscillator circuit during the first measurement period.

8. The device of claim 7, wherein the PLL is configured to be decoupled to the oscillator circuit during the second measurement period.

9. The device of claim 1 further comprising:
a digital to analog (DAC) converter configured to receive the first and second modified data signals from the gain control circuit, configured to convert the first and second modified data signals to first analog data signal and a second analog data signal, and further configured to provide the first and second analog data signals to the oscillator circuit.

10. The device of claim 1, wherein the data source is a Gaussian frequency-shift keying (GSFK) data source configured to generate data transmitted over a wireless connection of a mobile communications device.

11. The device of claim 1, wherein the data source is a look-up table.

12. A method comprising:
determining, using a calibration circuit, a first frequency of a first output signal generated by an oscillator circuit during a first measurement period, the first output signal being generated based on a first data signal representing, at least in part, a first data value, the first data signal being received from a gain control circuit;
determining, using the calibration circuit, a second frequency of a second output signal generated by an oscillator circuit during a second measurement period, the second output signal being generated based on a second data signal representing, at least in part, a second data value, the second data signal being received from the gain control circuit;
generating, using the calibration circuit, an adjustment value based on the first frequency, the second frequency, and a reference value, the adjustment value identifying a ratio between the reference value and a difference between the first frequency and the second frequency; and
adjusting a gain of the gain control circuit based on the generated adjustment value.

13. The method of claim 12, wherein the oscillator circuit includes a phase-locked loop (PLL), and wherein the method further comprises:
setting the PLL to a predetermined frequency.

14. The method of claim 13 further comprising:
coupling the PLL to the oscillator circuit in response to the generating of the first data signal.

15. The method of claim 14 further comprising:
decoupling the PLL to the oscillator circuit prior to the generating of the second data signal.

16. The method of claim 15 wherein the coupling of the PLL comprises turning on a charge pump of the PLL, and wherein the decoupling of the PLL comprises turning of the charge pump.

17. The method of claim 15 wherein the coupling of the PLL comprises closing a switch, and wherein the decoupling of the PLL comprises opening a switch.

18. A system comprising:
a digital subsystem comprising:
a data source configured to generate a first data signal based on a first data value, and further configured to generate a second data signal based on a second data value;
a gain control circuit configured to receive the first and second data signals from the data source, and further configured to generate a first modified data signal and a second modified data signal by amplifying the received first and second data signals by a gain;
a control subsystem comprising:
an oscillator circuit configured to generate a first output signal and a second output signal based, at least in part, on the first and second modified data signals, the first output signal having a first frequency, and the second output signal having a second frequency; and
a calibration circuit configured to receive the first and second output signals generated by the oscillator circuit, configured to determine an adjustment value based on the received first and second output signals, and further configured to change the gain of the gain control circuit based on the determined adjustment value.

19. The system of claim 18, wherein the calibration circuit is configured to determine the adjustment value based on a comparison between a difference value and a reference value, the difference value representing a difference between the first frequency and the second frequency, and wherein the calibration circuit includes at least one frequency counter configured to measure the first frequency during a first measurement period, and further configured to measure the second frequency during a second measurement period.

20. The system of claim 19, wherein the data source is configured to generate the first data value during the first measurement period,
wherein the at least one frequency counter is configured to measure the first output signal during the first measurement period,
wherein the data source is further configured to generate the second data value during the second measurement period,
wherein the at least one frequency counter is further configured to measure the second output signal during the second measurement period,
wherein the first data value is different than the second data value,
wherein the oscillator circuit is a voltage controlled oscillator configured to generate the first frequency based, at least in part, on an amplitude of the first modified data signal, and further configured to generate the second frequency based, at least in part, on an amplitude of the second modified data signal, and
wherein the oscillator circuit includes a phase lock loop (PLL) configured to regulate a phase and frequency of the oscillator circuit.

\* \* \* \* \*